United States Patent [19]

Kreinberg

[11] Patent Number: 4,959,026
[45] Date of Patent: Sep. 25, 1990

[54] POWER DISTRIBUTION ADAPTER
[75] Inventor: Earl R. Kreinberg, Phoenix, Ariz.
[73] Assignee: AMP Incorporated, Harrisburg, Pa.
[21] Appl. No.: 423,541
[22] Filed: Oct. 11, 1989

Related U.S. Application Data

[60] Continuation of Ser. No. 235,391, Aug. 23, 1988, abandoned, which is a division of Ser. No. 65,239, Jun. 22, 1987, Pat. No. 4,790,760.

[51] Int. Cl.⁵ .......................................... H01R 25/00
[52] U.S. Cl. .................................. 439/651; 439/654
[58] Field of Search ................. 439/638, 650–652, 439/654, 655, 660, 668

[56] References Cited

U.S. PATENT DOCUMENTS

| | | | |
|---|---|---|---|
| 3,215,975 | 11/1965 | Kinkaid | 339/256 |
| 3,409,862 | 11/1968 | Lynch et al. | 339/196 |
| 3,474,394 | 10/1969 | Hammell et al. | 339/176 |
| 3,496,523 | 2/1970 | Gluntz | 339/192 |
| 3,656,093 | 4/1972 | Kinkaid | 339/217 S |
| 4,125,313 | 11/1978 | Sipp et al. | 439/651 |
| 4,153,321 | 5/1979 | Pombrol | 439/388 |
| 4,402,564 | 9/1983 | Frantz | 339/91 R |
| 4,585,285 | 4/1986 | Martens | 339/17 LC |
| 4,740,167 | 4/1988 | Millhimes et al. | 439/654 |
| 4,834,673 | 5/1989 | Beinhaur et al. | 439/422 |

FOREIGN PATENT DOCUMENTS 60-110632  5/1985  Japan .

OTHER PUBLICATIONS

Amp Incorporated Buyers Guide, 1976, pp. 791–792, "Dual Disconnect".
"Commercial Interconnection System (Modular Board-to-Board and Board-to-Wire System", AMP Incorporated Catalog 73–108, Revised 4–86.
Addendum FIG. 1-5, Photographs of Prior Art Product of IBM Corporation.

Primary Examiner—Paula A. Bradley
Attorney, Agent, or Firm—Anton P. Ness; Eric J. Groen

[57] ABSTRACT

A power distribution system includes flexble cable interconnected to receptacle connectors which can be interconnected to mother boards or daughter cards. To assist in the distribution of power an adapter member is disclosed which can be interconnected to a post header or directly to a pin field. The adapter member includes two rows of pins which are commoned to each other and to a receptacle portion which is interconnectable to the posts in the post header or to the pins in the pin field.

4 Claims, 8 Drawing Sheets

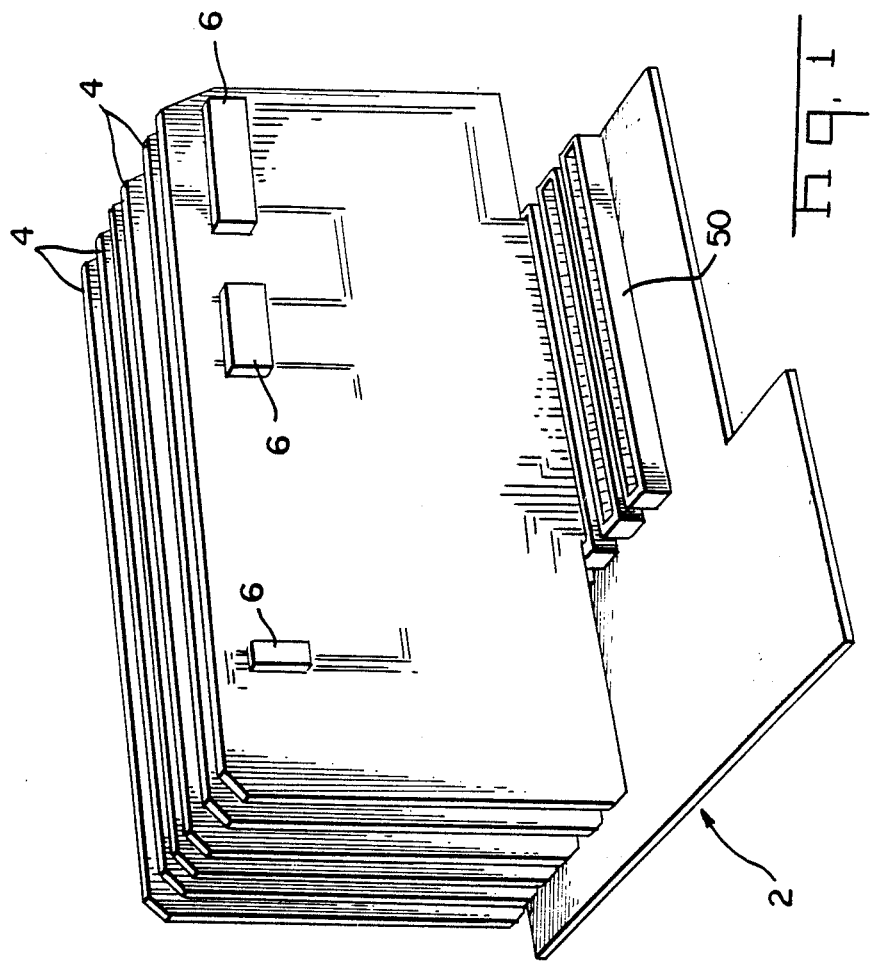

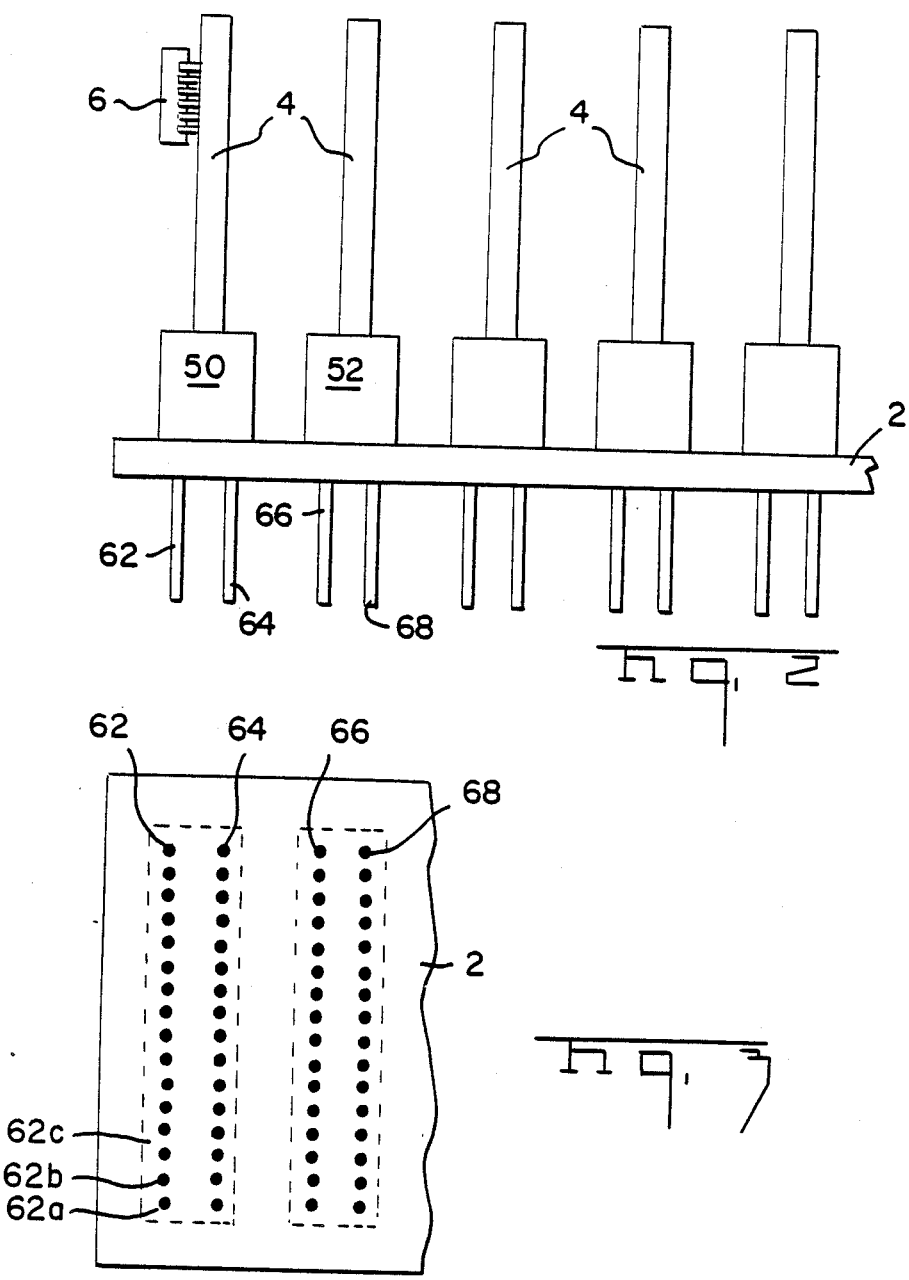

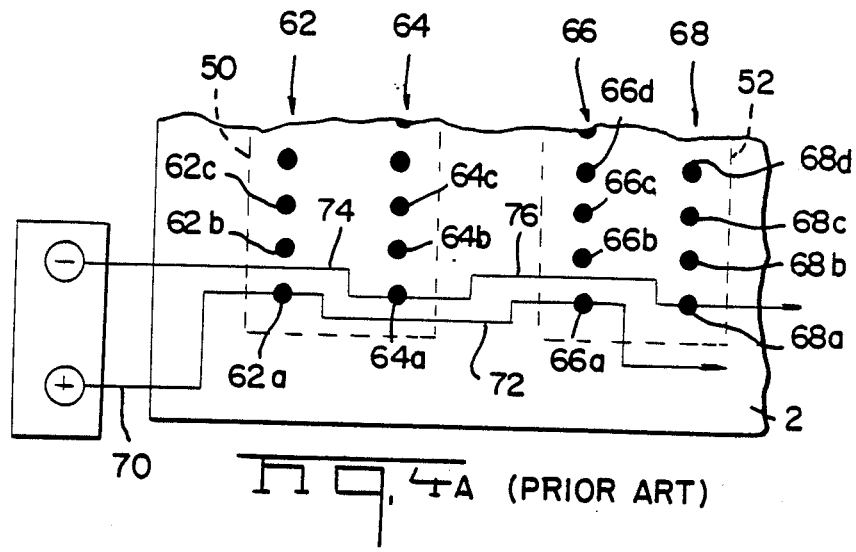
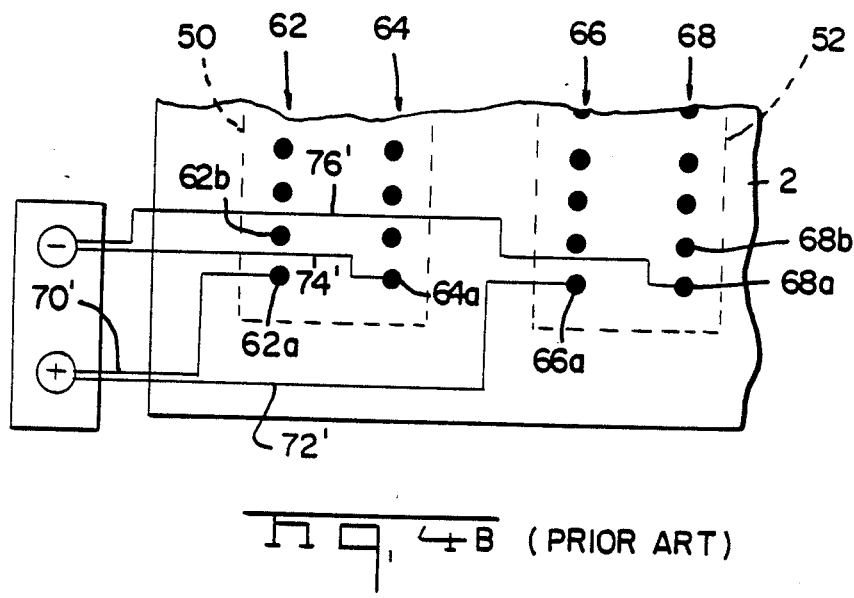

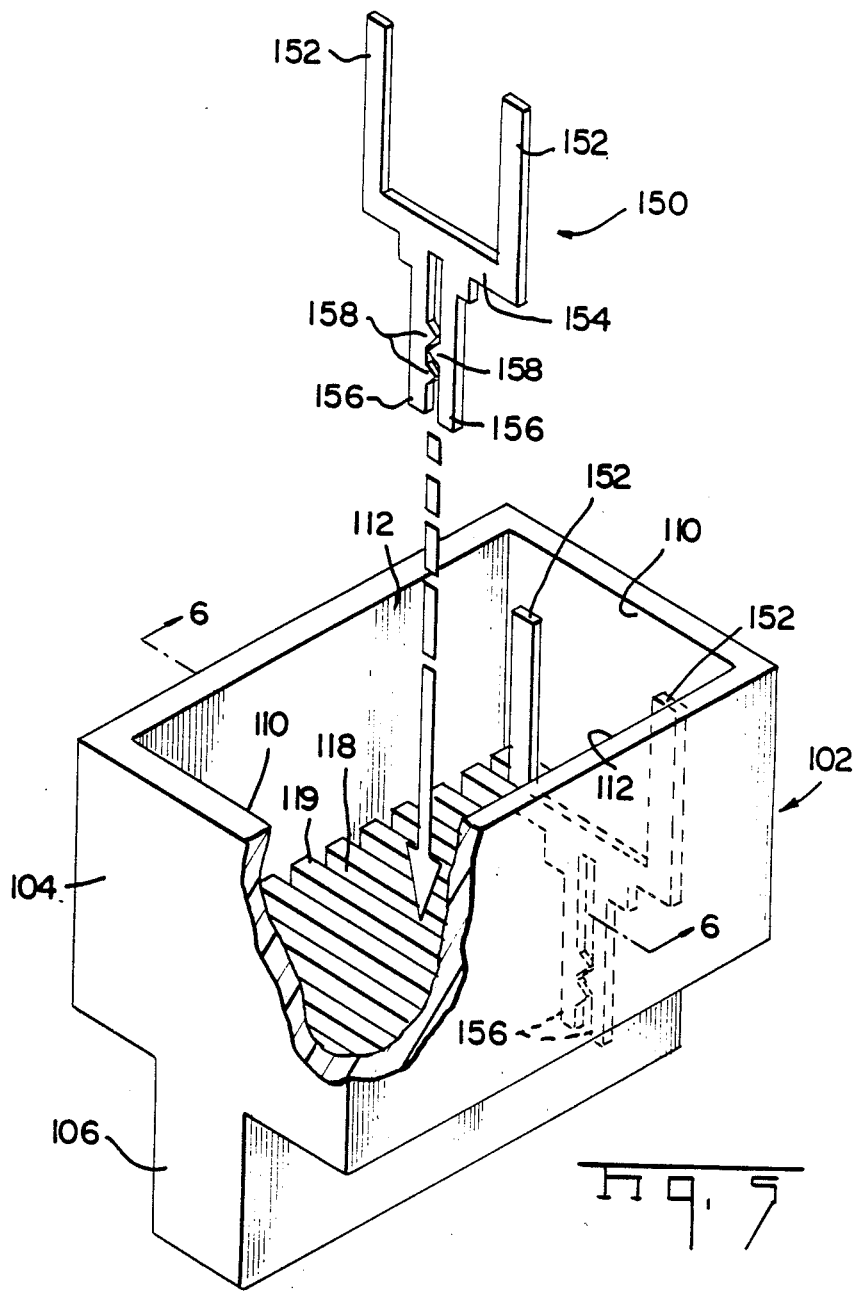

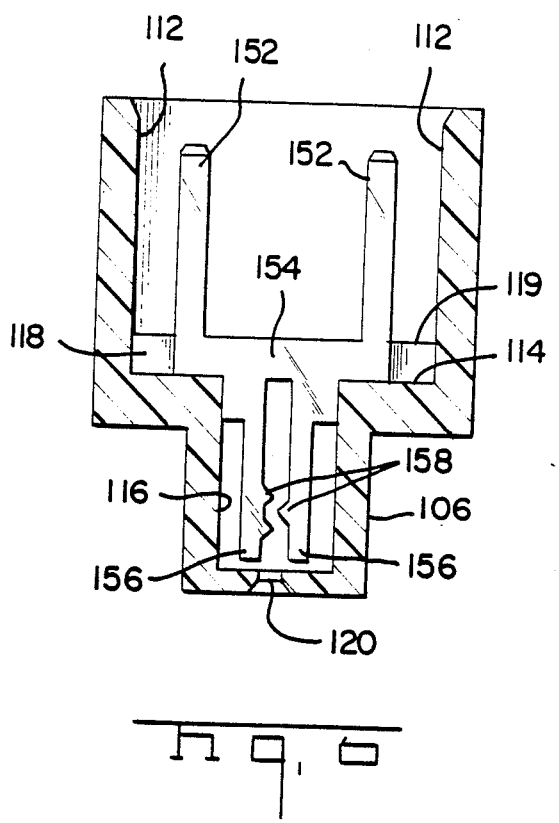

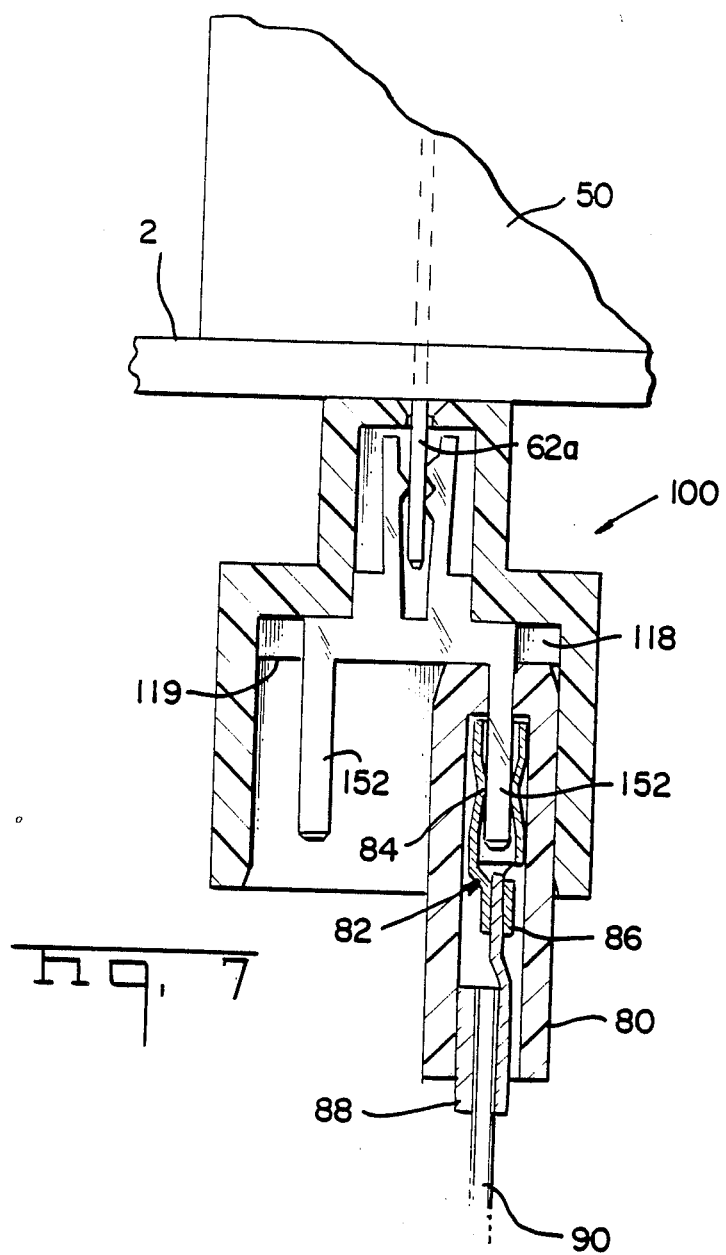

POWER DISTRIBUTION ADAPTER

This application is a continuation of application Ser. No. 235,391 filed Aug. 23, 1988, now abandoned, which was a divisional of application Ser. No. 065,239 filed June 22, 1987, now U.S. Pat. No. 4,790,760.

BACKGROUND OF THE INVENTION

1. Field of the Invention

The instant invention relates to an apparatus and method for electrically distributing power to a plurality of electrical devices.

2. Description of the Prior Art

The present state of technology with respect to the distribution of power from mother boards to daughter cards within computers or other electronic packaging systems is either handled by bringing power to the mother board and distributing the power to the daughter cards via circuit traces on the mother boards, or by bringing power directly from a power source to the connectors which house the daughter cards.

Daughter cards are aligned on the mother board in lateral arrays upstanding from the mother board in vertical planes. The daughter cards include a plurality of integrated circuit hardware mounted thereon including both logic and memory chips. The daughter cards include several traces which terminate to one side edge for interconnection to an edge card connector. The traces include both traces for data and power, as the circuit components must be powered.

The mother board is typically configured as a large printed circuit board consisting of a nonconductive material such as a glass epoxy. The mother board also includes a plurality of edge card connectors to which the daughter cards are connected. The edge card connectors include pins projecting through holes in the mother board to form a dense pin field on the back side of the mother board. As the daughter cards include both signal and power traces on the board, the pins which form the pin field are interconnected to both power and data.

The increasing need to conserve more printed circuit board space and to more densely populate the printed circuit daughter cards with more components has led to the requirement for more power to the daughter cards to power the components.

SUMMARY OF THE INVENTION

It is an object of the instant invention to reduce the labor intensiveness of the prior art methods of distributing power to pluralities of edge card connectors on mother boards.

It is a further object to increase the amount of current capable of being carried through the current carrying media, and delivered to the designated pins of the pin field on the edge card connector alleviating the necessity of increasing the number of dedicated pins on the edge card connector to power which conserves pins for the distribution of data.

It is a further object of the invention to provide a means for flat cable to be used in the distribution of power to a plurality of daughter cards.

In an electronic system including a mother board having at least two edge card connectors mounted thereon with at least two edge card connectors housing daughter cards therein where the edge card connectors include pins projecting through the mother board to form a pin field on an underside of the mother board with the the edge card connector pins being preselected and dedicated for the transfer of both power and data with the edge card connectors including a like plurality of pins dedicated to a positive and a negative polarity of d.c. power; a method of distributing the power from a power source to the daughter cards includes or is characterized by the steps of providing a first insulated cable having a flat conductor in which a current is provided to such first flat conductor from a power source; the current is thereafter divided from the flat conductor into separate current paths, the divisions being equal in number to the plurality of pins on a first edge card connector dedicated to the positive polarity; the individual current paths are thereafter interconnected to respective pins of the positive polarity on the first edge card connector. A second insulated cable is included which has a flat conductor therein, the first and second flat conductors being commoned together. The current from the second flat conductor is divided into separate current paths equal in number to the plurality of pins on the second edge card connector which are designated to the positive polarity. Finally, a return path from the negative polarity of pins on the first and second edge card connectors are provided to the power source.

An adapter which is capable of being used with the pin field in the above-described method which is used for distributing power to a number of devices along the length of a power cable includes at least one electrical contact means which has two first electrical terminal means positioned in an array, means to common the first electrical terminal means together and at least one second electrical terminal means commoned to the first electrical terminal means. An insulative housing means is provided which at least partially surrounds the electrical contact means such that when current is applied to one of the first electrical terminal means, a portion of the current is applied to a device which is connected to the second electrical terminal means and the remainder of the current is transferred to other devices through the remainder of the first electrical terminal means and downstream along the length of the power cable.

BRIEF DESCRIPTION OF THE DRAWINGS

FIG. 1 is an isometric view of a mother board or backplane depicting the environment in which; the subject invention will operate.

FIG. 2 is a side view of the mother board of FIG. 1 showing the pin field with greater clarity.

FIG. 3 is a bottom view of the pin field of FIG. 2.

FIGS. 4A and 4B are exploded views of sections of the pin field of FIG. 3 showing prior art methods of power distribution between daughter cards.

FIG. 5 is an isometric view of the housing of the instant invention showing a terminal exploded therefrom.

FIG. 6 is a cross-sectional view through lines 6—6 of FIG. 5 showing the terminal installed.

FIG. 7 is a cross-sectional view similar to that of FIG. 6 showing the adapter of the instant invention interconnected to the pin field on the mother board and a receptacle header interconnected to flat cable bringing power into the mother board.

DETAILED DESCRIPTION OF THE PREFERRED EMBODIMENT

Figure 8:
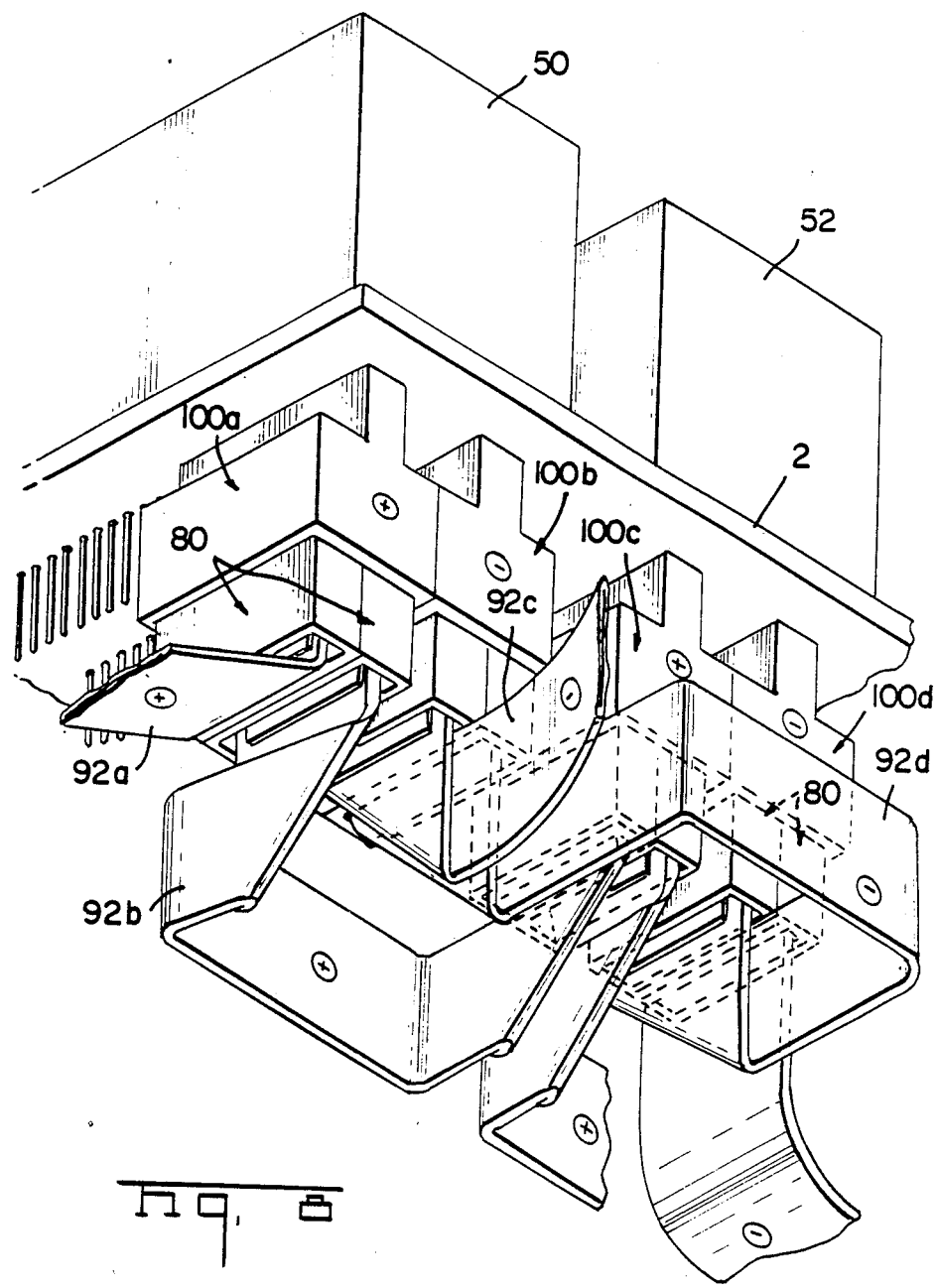
FIG. 8 is an isometric view showing several card edge connectors being interconnected with lengths of the flat power cable.

FIG. 1 shows a typical environment in which the subject application would be used, that is bringing power into electronic devices such as the mother board shown generally as 2. The mother board 2 is generally profiled as a printed circuit board having a plurality of daughter cards such as 4 being interconnected to the mother board 2 via the edge card connectors shown generally as 50. As shown in FIG. 1, a typical mother board would also consist of a plurality of dual inline packages (DIPs) such as 6 interconnected to the daughter cards either via DIP headers, or by being directly soldered to the card.

FIG. 2 shows a side view of a mother board 2 including such edge card connectors as 50 and 52 which include rows of pins such as 62-68 which form a pin field on the back side of a mother board. FIG. 3 shows the pin field from an underside where the rows 62-68 can be seen more clearly. The rows 62-68 are formed by individual pins, for example row 62 is formed by pins 62a-62c. It is to be understood that the actual rows of pins may include as many as 60 pins per row, but only a few pins will be discussed herein for simplicity.

Referring now to FIGS. 4A and 4B, the present method of bringing power to the daughter cards will be described. FIG. 4A shows a first example where the power is brought to the pins from the power source and respective pins in the next connector are then connected via the same electrical media, be it traces on the mother board or discrete wires from the power source; although if discrete wires are used, wire wrapping is typically used.

Referring first to FIG. 4A, the edge card connector 50 includes rows 62 and 64, while edge card connector 52 includes rows 66 and 68. It is typical for the power to be brought into the edge card connectors via the pin field, via dedicated pins, for example several of the pins in the row 62 would be dedicated to one polarity of d.c. power while the opposite row 64 would include a like plurality of opposite pins dedicated to the other polarity of the d.c. power. For example, with a connector having for example 60 pins in each row, typically 10 pins would be used in each row for the distribution of d.c. power, one row of pins having a positive polarity and the opposing row of pins having a negative polarity. The positive polarity (+) would then be interconnected to a first pin such as 62a, which would then be continued on to interconnect the same respective pin in the adjacent connector, and the sequence would be carried out through all edge card connectors. The minus (−) polarity would then be similarly interconnected to pin 64a and jumpered to the next respective pin in the adjacent connector. This method of interconnection has an inherent drawback in that the current in the segments 70 and 74 is larger than in the segments 72 and 76 as the current is summed at the nodes, which in this case are the pins. If the portions 70 and 74 are circuit board traces, there will be a physical limitation to the size of the traces due to the area on the mother board 2, and therefore the current carrying capability of the traces is limited. If the portions 70 and 74 are discrete wire which is wire wrapped, the job becomes more difficult as the wire stiffness increases as the wire gauge increases.

FIG. 4B shows an alternate version of wiring the card edge connectors which includes running dedicated portions such as 70′-76′ to each pin from the power source. As can be appreciated, whether the portions are discrete wire or circuit traces, the number of portions is increased over the configuration shown in FIG. 4A. For example, if five card edge connectors are used and each connector has ten pins in each row dedicated to power, there would be 100 traces or discrete wires extending from the power source to the pin field. If printed circuit board traces are used, 100 traces would use an inordinate amount of board space, and if 100 discrete wires were used, the labor intensity would be extremely high.

The instant invention removes the shortcomings of the prior methods of power distribution by incorporating means for flat cable as the power distribution media. The flat cable is shown more illustratively in U.S. Pat. No. 4,834,673, now abandoned, the subject of which is incorporated herein. By using flat cable as the power distribution media, the flat cable can be adjusted in cross section to accommodate the current requirements without the concerns of wire wrapping limitations. Also, by using the flat cable as the power distribution media, the quantity of pins can be conserved. If discrete wires or printed circuit board traces are used, when the current carrying capability of the media is met, more pins from the pin field must be dedicated for the distribution of power. This requires that the edge card connector must be increased overall to retain the same number of positions for the distribution of data.

The power distribution would generally include flexible insulated cable forming flexible busses interconnected to the pin fields. As described in U.S. Pat. No. 4,834,673 cited above, an insulation displacement interconnect would allow for the flat cable to be connected to crimp type contacts of electrical connectors. An adapter will now be disclosed herein which will facilitate the connection and disconnection of the flexible busses which are formed by the flat flexible cable portions.

Referring first to FIG. 5, a housing 102 is shown as generally including an upper compartment 104 and a lower receptacle compartment 106. The housing 104 has an inner cavity formed by inner sidewalls 112 and inner end walls 110. The inner cavity has a floor 119 which has a plurality of channels 118 extending thereacross which form recesses for electrical terminals which will be described herein.

The terminal 150 of the adapter member generally includes a bar portion 154 having two post members 152 upstanding therefrom and a receptacle portion having a pin-receiving opening defined by two leg members 156 extending downwardly therefrom, each leg member having at least one raised contact portion or node 158 extending into the pin-receiving opening. Two such nodes 158 are located along one leg member 156 and extend toward the other leg member 156 and are spaced axially so that a node 158 on the other leg member 156 is located axially therebetween. As seen in FIGS. 6 and 7, the node arrangement defines a constriction dimensioned so that a pin 62a received between leg members 156 is engaged by the nodes and must deflect apart leg members 156 to pass by and be fully received into the receptacle portion of contact 150.

Referring now to FIG. 6, the terminal 150 is shown positioned within the housing 102, the terminals residing within the plurality of lower cavities 118 such that the bar portions 154 of the terminals 150 reside on a floor 114. The cavities 118 are spaced laterally to space the terminals into two rows of laterally spaced posts. The lower receptacle portion is defined by inner sidewalls 116 which receive the lower leg members 156 and positions them adjacent to an opening 120 in the lower receptacle portion 106, leg portions 156 thus being exposed for electrical connection along the lower or board-proximate face of adapter 100.

FIG. 7 depicts a pin such as 62a projecting down through the mother board 2. The adapter member 100 is interconnected to the underside of the mother board and to the pins within the row 62 with the forked contacts straddling the pins within the row. An electrical connector 80 is interconnected to the flat cable 90, the connector 80 being of the type shown in U.S. Pat. Nos. 4,385,794 and 4,435,035. The interconnection member 88 is of the type described in U.S. Pat. No. 4,834,673 which allows a crimp type contact, such as the type shown in U.S. Pat. No. 4,385,794, to be interconnected to the flat cable 90. The interconnection member would include finger portions which are on the same pitch as the centerline spacing of contacts within the connector. Furthermore, the interconnect member 88 would include finger portions equal in number to the pins which are dedicated to power in one edge card connector. The contact 82 includes a crimp end which is affixed to the end of the interconnect member 88, and a resilient contact portion 84 which electrically connects to the post 152 exposed for electrical connection along the connector-receiving face of adapter 100.

As shown in FIG. 8, several adapters 100a–100d can be attached to the pin field with several flexible buss sections interconnecting the successive edge card connectors. For example, if ten pins in each row of the edge card connector are devoted to power, two adapters 100 would be used for each edge card connector, one for each polarity, each having ten contacts within the housing 102. The interconnect portion 88 would include ten fingers and the connector would be a ten position connector with each contact being interconnected to a separate finger portion. This would allow a first bussing portion 92a to be connected from the power source to the first adapter member, and a second bussing portion 92b having the same polarity as bussing portion 92a, to be interconnected to adapter member 100c. Another bussing portion 92c would be interconnected to the opposite polarity and would be interconnected to the adapter member 100b, while a further bussing portion 92d further connects the adapter member 100d to the opposite polarity. It should be appreciated that the flexible bussing portions, comprising the flat cable, interconnect members, and connectors, could be mass produced for specific applications and the installation would be greatly simplified by the adapter members. The flexible busses can also be field installed without great difficulty.

Figure 9:
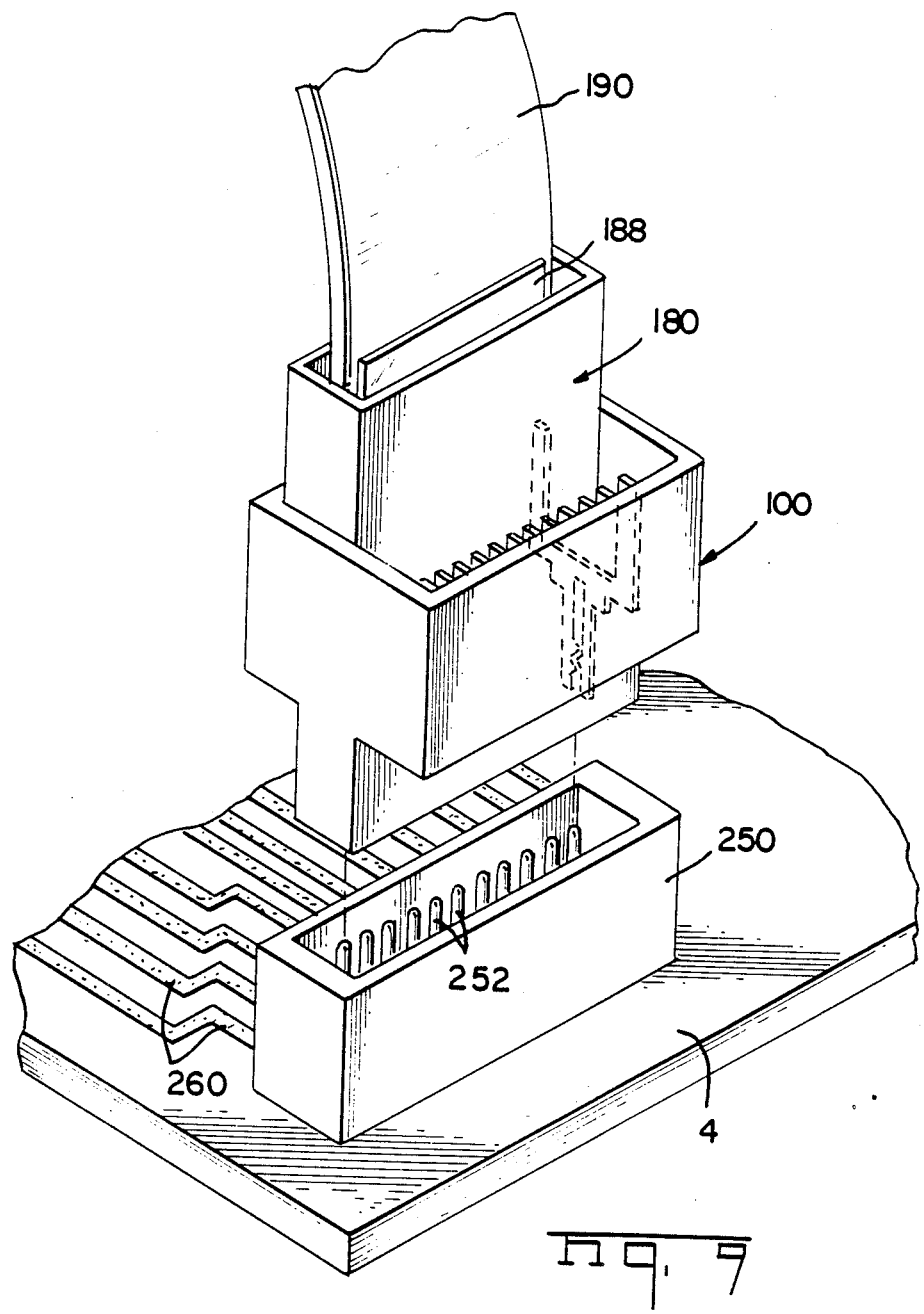
FIG. 9 shows the adapter being used to interconnect power directly to the daughter cards.

A further application of the above mentioned adapter member 100 relates to distributing the power directly to the daughter cards as shown in FIG. 9. The adapter member 100 may be received within a post header, such as 250, which includes a plurality of posts 252 which are soldered or otherwise interconnected to a like plurality of traces 260 on the printed circuit board 4 which distribute power to the components such as the DIP packages which require the power. Power will be brought into the adapter member 100 via a bussing member 190 again comprising flat flexible cable which is interconnected to a receptacle 180, via an interconnect section 188 similar to interconnect section 88 described above.

The header 180 generally includes receptacle contact members having resilient contact portions for contacting the posts 252. Once again, bussing sections could be looped from daughter card to daughter card, or from one section of a daughter card to another section of the same daughter card. It should be appreciated that the adapter member 100 and the method of distributing power in conjunction with the adapter is a great improvement to the present methods of power distribution.

The above described method and apparatus for the distribution of power was made with reference to the specific drawings attached hereto, but should not be taken to limit the claims which follow.

What is claimed is:

1. An electrical adapter for distributing power to a plurality of devices mounted on a panel and at least electrically connected to respective arrays of electrical pins extending from the panel for electrical connection therewith by electrical power means, comprising:
   an insulative housing having a cable face and an opposing panel face, said housing including a plug-receiving cavity along said cable face to receive thereinto plug portions of first and second connectors terminating first and second cable means; and
   a plurality of electrical contacts secured in said housing extending between said cable face and said panel face thereof, each said contact having a commoning bar, a receptacle section extending forwardly from said commoning bar and adapted to be matable with a respective said pin and exposed along said panel face for electrical connection therewith, and a pair of post sections coextending in parallel rearwardly from said commoning bar and disposed within said plug-receiving cavity;
   first and second ones of said post sections of said pairs of post sections being aligned in respective first and second rows within said plug-receiving cavity for electrical connection with respective corresponding contact sections of respective rows of terminal means terminated to respective first and second electrical cables and disposed within respective first and second housing means of said first and second cable connectors therefor,
   whereby the adapter is pluggable to a pin array of the device and in turn defines two like post arrays similar to said device pin array by said first and second post sections in said plug-receiving cavity to receive thereinto plug portions of both first and second housings side-by-side into a common end so that the first cable can transmit power into the assembly by a connector otherwise matable with said device pin array, and the assembly can both distribute power to the device and transmit power to the second cable for distribution to other devices.

2. An electrical adapter as set forth in claim 1 wherein said receptacle sections each include two forked members integrally joined to and coextending from said commoning bar and defining cantilever beams having a pin-receiving opening therebetween, one of said forked members having two contact nodes formed thereon, while the other of said forked members at least has one contact node intermediate the two nodes on said one forked member, said nodes extending into said pin-receiving opening and defining a constriction dimensioned less than the width of a said pin, and said forked members thereby being adapted to be deflected apart by a said pin received therebetween upon engagement with said nodes thereon, whereby a said pin being received into said pin-receiving opening must engage said nodes and deflect apart said two forked members to pass said constriction and be fully received into said pin-receiving opening.

3. An assembly for distributing power to a plurality of devices mounted on a panel and at least electrically connected to respective arrays of electrical pins extending from the panel for electrical connection therewith by electrical power means, comprising a first cable including a plurality of terminal means terminated to an end thereof secured within a respective housing means defining a respective first connector, and a second cable having a plurality of respective terminal means terminated to an end thereof secured within a respective housing means defining a respective second connector, and an electrical adapter matable with said respective first and second connectors along a common face;

said electrical adapter comprising:

an insulative housing having a cable face and a panel face, said housing including a plug-receiving cavity along said cable face for receiving thereinto plug portions of first and second connectors terminating first and second cable means; and a plurality of electrical contacts secured in said housing extending between said cable face and said panel face thereof, each said contact having a commoning bar, a receptacle section extending forwardly from said commoning bar and adapted to be matable with a respective said pin and exposed along said panel face for electrical connection therewith, and a pair of post sections coextending in parallel rearwardly from said commoning bar and disposed within said plug-receiving cavity; first and second ones of said post sections of said pairs of post sections being aligned in respective first and second rows within said plug-receiving cavity for electrical connection with respective corresponding contact sections of respective rows of terminal means of said first and second connectors, whereby the assembly is pluggable to a pin array of the device and in turn defines two like post arrays similar to said device pin array by said first and second post sections in said plug-receiving cavity to receive thereinto plug portions of both first and second connectors side-by-side into a common end so that the first cable can transmit power into the assembly by a connector otherwise matable with said device pin array, and the assembly can both distribute power to the device and transmit power to the second cable for distribution to other devices.

4. An assembly as set forth in claim 3 wherein said receptacle sections each include two forked members integrally joined to and coextending from said commoning bar and defining cantilever beams having a pin-receiving opening therebetween, one of said forked members having two contact nodes formed thereon, while the other of said forked members at least has one contact node intermediate the two nodes on said one forked member, said nodes extending into said pin-receiving opening and defining a constriction dimensioned less than the width of a said pin, and said forked members thereby being adapted to be deflected apart by a said pin recevied therebetween upon engagement with said nodes thereon, whereby a said pin being received into said pin-receiving opening must engage said nodes and deflect apart said two forked members to pass said constriction and be fully received into said pin-receiving opening.

* * * * *